United States Patent [19]

Murata et al.

[11] Patent Number: 4,973,843
[45] Date of Patent: Nov. 27, 1990

[54] PYROELECTRIC INFRARED SENSOR

[75] Inventors: Michihiro Murata, Kyoto; Shyzi Sawada, Tokyo; Muneharu Nishio, Kanagawa; Satoru Ito, Tokyo, all of Japan

[73] Assignee: Murata Mfg. Co., Ltd., Kyoto, Japan

[21] Appl. No.: 400,471

[22] Filed: Aug. 29, 1989

[30] Foreign Application Priority Data

Aug. 30, 1988 [JP] Japan .................. 63-215372

[51] Int. Cl.$^5$ .............................. G01J 5/02; G01J 5/00
[52] U.S. Cl. ................... 250/338.3; 250/338.1; 250/338.4
[58] Field of Search ............... 250/338.3, 338.4, 338.2, 250/338.1

[56] References Cited

U.S. PATENT DOCUMENTS

| | | | |
|---|---|---|---|
| 4,110,616 | 8/1978 | Porter et al. | 250/338.3 |
| 4,284,888 | 8/1981 | Appleby | 250/338.3 |
| 4,383,174 | 5/1983 | Matsumura et al. | 250/338.3 |
| 4,469,943 | 9/1984 | Turnbull | 250/338.3 |
| 4,555,414 | 11/1985 | Hoover et al. | 427/43.1 |
| 4,808,822 | 2/1989 | Manning et al. | 250/338.3 |

FOREIGN PATENT DOCUMENTS

| | | | |
|---|---|---|---|
| 61-91528 | 5/1986 | Japan | 250/338.3 |
| 1504283 | 3/1978 | United Kingdom | 250/338.3 |

OTHER PUBLICATIONS

Buchanan, "Ceramic Materials for Electronics", Marcel Dekker Inc. 1986, p. 7.
Weast, "CRC Handbook of Chemistry and Physics" CRC Press, 1974-1975 55th Edition, pp. E4, E5, E17 and E206.

Primary Examiner—Constantine Hannaher
Assistant Examiner—Jacob Eisenberg
Attorney, Agent, or Firm—Koda & Androlia

[57] ABSTRACT

A pyroelectric sensor senses the infrared rays radiated from the human body and outputs the detected infrared rays as an electric signal. It detects the trespass of somebody on a room and is used for the prevention of crimes and the like. The pyroelectric sensor includes a substrate, an element-pair disposed on the surface of the substrate and an amplification circuit for amplifying the current signals output from the element-pair. The substrate is composed of a material having a thermal conductivity as low as not more than 0.04 cal/cm sec° C. so as to prevent the heat from being released through the substrate. A hole is formed in the substrate. The amplification circuit amplifies the current signals of the element-pair, thereby dispensing with the impedance transformation which is inevitable in the prior art. Thus, the sensitivity of detection is improved and the manufacture of the sensor is facilitated.

18 Claims, 2 Drawing Sheets

PYROELECTRIC INFRARED SENSOR

BACKGROUND OF THE INVENTION

The present invention relates to a pyroelectric infrared sensor for sensing the infrared rays radiated from a moving body such as the human body.

As an apparatus for detecting the trespass of somebody on a room, a pyroelectric infrared sensor has recently come into wide use. The pyroelectric infrared sensor is provided with a pair of elements for sensing the infrared rays radiated from the human body, and is used for control such as prevention of crimes by utilizing current signals output from the pair of elements in correspondence with the dose of radiation of the infrared rays. A pyroelectric sensor composed of a hybrid IC has recently been widely utilized in the light of reduction in the size of an apparatus and the easy handling property.

FIG. 5 is a sectional view of the structure of this kind of pyroelectric infrared sensor composed of a hybrid IC. In FIG. 5, on the upper side of a substrate 1 of alumina ($Al_2O_3$) are provided a pair of elements 2 for outputting currents corresponding to the dose of radiation of infrared rays. In order to enhance the sensitivity of detection of the element-pair, it is necessary to efficiently convert the quantity of heat obtained from the infrared rays into a current signal. For this purpose, in a conventional apparatus, the element-pair 2 is disposed on the substrate 1 with a predetermined space 3 so as to prevent the heat caused by the infrared rays and received by the element-pair 2 from being released through the alumina substrate 1 having a good thermal conduction (the thermal conductivity of this kind of alumina substrate is 0.07 to 0.4 (cal/cm sec°C.) and the element-pair 2 and the substrate 1 are supported and fixed at four points of the respective corners of the element-pair 2 by conductive pastes 4.

On the substrate 1 a resistor 5 and an FET (Field Effect Transistor) 6 are provided, and the current signals output from the element-pair 2 are converted into a low impedance voltage signal defined by $V = Q/C$ according to the impedance transformation by means of the FET 6. The reference numeral 7 represents a terminal pin for supplying a drive power for driving the circuit such as the element-pair 2, the resistor 5 and the FET 6, and taking out the current signal from the element-pair 2. The reference numeral 8 represents a stem for supporting the terminal pin 7.

However, since the conventional pyroelectric infrared sensor uses an alumina plate having a good thermal conduction for the substrate 1, when the shapes such as the diameters of the conductive pastes 4 at the respective points are different from each other, the quantities of heat released toward the substrate 1 through the respective conductive pastes 4 are different depending on the positions. Consequently, the current signals output from the element-pair 2 become out of balance, which is an obstacle to the processing of the current signals. In order to avoid such an obstacle, it is necessary to make the shape such as the diameter and the length of the conductive paste 4 at each position uniform, which is very difficult in the process for manufacturing the sensor.

In the conventional sensor, the current signals output from the element-pair 2 are first converted into a voltage signal by the impedance transformation by means of the FET 6. On the other hand, since the sensitivity of the infrared sensor is influenced both by the thermal time constant $\tau_T$ when the heat due to infrared rays is converted into a current signal and by the electric time constant $\tau_E$ when the FET 6 is operated on/off, the impedance transformation carried out by means of the FET 6 is an obstacle to the enhancement of the sensitivity of detection of the infrared sensor.

SUMMARY OF THE INVENTION

Accordingly, it is an object of the present invention to eliminate the above-described problems in the prior art and to provide a pyroelectric infrared sensor which is capable of eliminating the difficulty in the assembly of the substrate and the element-pair in the process for producing the pyroelectric infrared sensor and which is sufficiently enhancing the sensitivity of detection of the sensor.

The principle of enhancement of the sensitivity of detection of the present invention will first be explained.

The voltage sensitivity $R_V$ of detection of a voltage signal which is obtained by converting the current signals output from an element-pair by impedance transformation in a conventional pyroelectric infrared sensor (in other words, in a voltage mode) is generally represented as follows:

$$R_V = V/Io \qquad (1)$$
$$= (\eta \omega A R \lambda/G)(1 + \omega^2 \tau_T^2)^{-1/2}(1 + \omega^2 \tau_E^2)^{-1/2} \qquad (1)$$

wherein V represents an input voltage, Io an incident power (W), $\eta$ an emissitivity, $\omega$ an angular frequency (Hz), A a light receiving area ($cm^2$), R a synthetic resistance ($\Omega$), $\theta$ a pyroelectric coefficient, G a thermal diffusion constant (J/KS), $\tau_T$ a thermal time constant and $\tau_E$ an electric time constant.

On the other hand, in the case of a current mode in which the currents output from a pair of elements are amplified by an amplification circuit such as an operational amplifier, since there is no term concerning the electric time constant $\tau_E$ in the formula (1), the current Ip output from the element-pair is represented by the following formula:

$$Ip = \eta Io \lambda \omega A / \{2G(1 + (\omega \tau_T)^2)^{1/2}\} \qquad (2)$$

The current sensitivity Ri of detection is represented by the following formula:

$$Ri = Ip/Io \qquad (3)$$
$$= \eta \lambda \omega A / \{2G(1 + (\omega \tau_T)^2)^{\frac{1}{2}}\}$$

According to the formula (3), the current sensitivity Ri of detection has no relation to the electric time constant $\tau_E$ and governed only by the thermal time constant $\tau_T$. That is, it is possible to enhance the current sensitivity of detection by reducing the thermal time constant $\tau_T$, in other words, by using a substrate having a low thermal conductivity. The present invention has been achieved on the basis of this principle.

To achieve the above-described object, the present invention has the following structure.

Firstly, the present invention provides a pyroelectric infrared sensor having a substrate and an element-pair which is disposed on the surface side of the substrate and which outputs current signals corresponding to the dose of radiation of infrared rays, characterized in that the substrate is composed of a material having a thermal conductivity of not more than 0.04 (cal/cm sec°C.).

In a pyroelectric infrared sensor having a substrate composed of a material having such a thermal conductivity, release of the heat to the outside through the substrate is reduced, the heat being caused by the infrared rays and supplied to the element-pair. The thermal time constant representing the degree of the release of heat is therefore reduced, whereby the sensitivity of detection of the element pair to the infrared rays is enhanced.

In addition, in the deposition of the element-pair on the substrate, the dependence of the thermal time constant on the position, the shape or the like of the element-pair is lowered, so that it is possible to set the positional accuracy, the dimensional accuracy or the like of the element pair lower than in the prior art, thereby facilitating the manufacture of a sensor.

As the material for forming the substrate, a composite material such as glass and an epoxy resin, and a ceramic material $BaO-SiO_2-Al_2O_3-B_2O_3-Cr_2O_3$ are usable.

A hole may be formed in the substrate so as to realize the reduction in the release of the heat caused by infrared rays more effectively.

Secondly, the present invention is characterized in that an amplification circuit for amplifying current signals which are output from the element-pair is provided on the surface of the substrate.

Since the amplification circuit amplifies the current signals output from the element-pair without the need for impedance transformation, the lowering of the sensitivity of detection due to the electric time constant is eliminated.

The amplification circuit includes an operational amplifier for amplifying a current. By adding a low pass filter for removing high-frequency noise to the amplification circuit, a more preferable external output of a current signal is obtained.

The above and other objects, features and advantages of the present invention will become clear from the following description of the preferred embodiments thereof, taken in conjunction with the accompanying drawings.

DESCRIPTION OF THE PREFERRED EMBODIMENTS

The embodiment of the present invention will be explained hereinunder with reference to the accompanying drawings.

Figure 1:
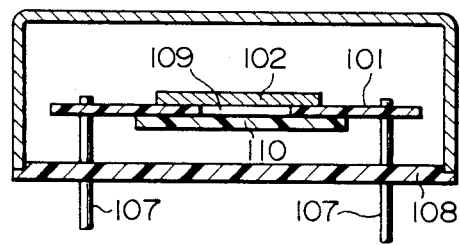
FIG. 1 is a sectional view of the structure of a first embodiment of a pyroelectric infrared sensor according to the present invention, wherein on the surface of a substrate 101 composed of a composite material of glass and an epoxy resin, an element pair 102 is provided and a hole 109 is formed on the substrate 101.

FIG. 1 shows an embodiment of a pyroelectric infrared sensor according to the present invention. In FIG. 1, a substrate 101 is composed of a composite material of glass and an epoxy resin, which is a material having a thermal conductivity as low as not more than 0.04 (cal/cm sec°C.). At the central portion of the substrate 101, a hole 109 for lowering the thermal conduction is provided. An element-pair 102 consisting of a pair of elements 102a, 102b are secured to the top surface side of the substrate 101 with the entire surfaces thereof in contact with the substrate 101. On the back surface side of the substrate 101, an operational amplifier 110 is mounted in such a manner as to cover the hole 109.

On the back surface of the substrate 101 on which the operational amplifier 110 is mounted, an amplifier circuit including the operational amplifier 110 is provided by means of surface mounting or the like, but it is omitted in FIG. 1.

Figure 2:
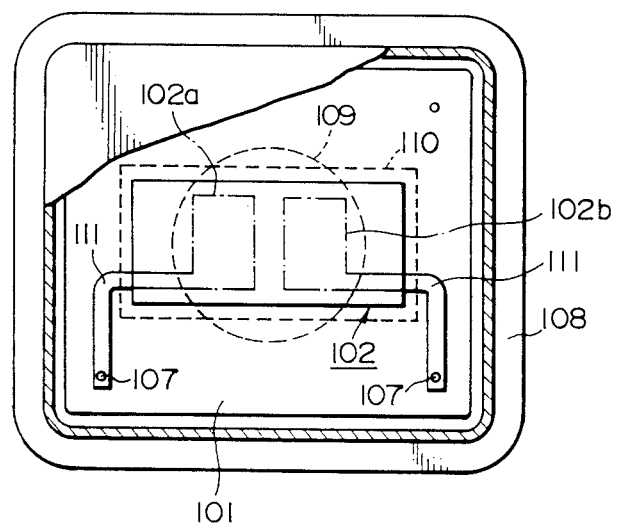
FIG. 2 is a partly sectional view of the structure of the pyroelectric infrared sensor shown in FIG. 1.

FIG. 2 is a partly sectional view of the structure of this embodiment, as seen from the top surface side of the substrate 101 on which the element-pair 102 is disposed.

In FIG. 2, the hole 109 and the operational amplifier 110 are indicated by the broken lines, and the elements 102a and 102b which constitute the element pair 102 are indicated by the one-dot chain lines. The elements 102a and 102b are connected to terminal pins 107 through conductive patterns 111 formed on the surface of the substrate 101, the terminal pins 107 supplying a driving power to the elements 102a, 102b and outputting an electric signals supplied from the elements 102a, 102b.

When a driving power is supplied from the terminal pins 107 to the element-pair 102 and the element-pair 102 is irradiated with infrared rays, each of the elements 102a and 102b which are differentially connected as will be described later outputs an electric signal corresponding to the dose of radiation of the infrared rays to the corresponding terminal pin 107.

Although each of the elements 102a and 102b has a rectangular shape in FIG. 2, the configuration may be any shape determined by the design of the element-pair 102. The amplification circuit is also omitted in FIG. 2 as in FIG. 1.

Figure 3:
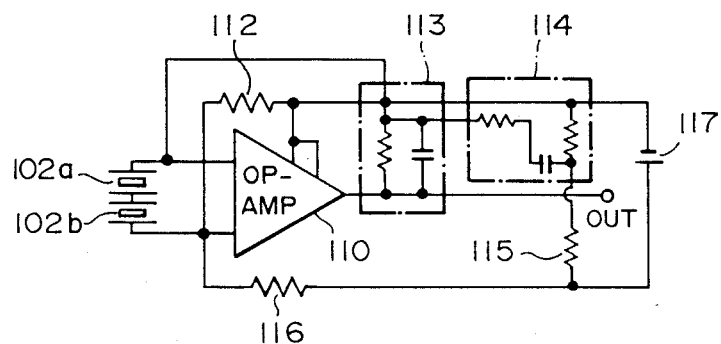
FIG. 3 is a circuit diagram of the pyroelectric infrared sensor shown in FIGS. 1 and 2, showing first and second filters 113 and 114 which are omitted in FIGS. 1 and 2.

FIG. 3 shows the amplification circuit. This circuit is composed of the elements 102a, 102b, the operational amplifier 110, a feedback resistance 112, a first low pass filter 113, a second low pass filter 114, resistors 115, 116 and an input power source 117. The operational amplifier 110 amplifies the differential output current of the elements 102a and 102b. The first and second low pass filters 113 and 114 eliminate a high-frequency noise component, the resistors 115 and 116 return the signal amplified by the operational amplifier 110 again to the operational amplifier 110 so as to amplify the signal again. A current signal obtained by amplifying the current signals from the elements 102a, 102b by the operational amplifier 110 and eliminating the noise component form the amplified signal is taken to the outside from the terminal pins 107.

Figure 5:
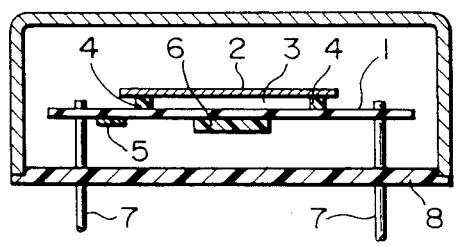
FIG. 5 is a sectional view of the structure of a conventional pyroelectric infrared sensor, wherein the element-pair 2 is bonded to the substrate 1 by the conductive pastes 4, and the FET 6 for executing the impedance transformation of current signals output from the element-pair 2 are shown.

According to this embodiment, since the substrate 101 is composed of a composite material of glass and an epoxy resin having a low thermal conductivity, the quantity of heat of the elements 102a, 102b obtained when receiving infrared rays is scarcely released through the substrate 101, so that it is unnecessary to provide the space 3 shown in FIG. 5 between the elements 102a, 102b and the substrate 101. It is therefore possible to dispose the elements 102a, 102b with the entire surfaces thereof except the portions facing the hole in contact with the substrate 101. In a conventional sensor, it is necessary to make the configurations such as the lengths and the sectional areas of the conductive pastes 4 uniform. In contrast, according to this embodiment, since the quantity of heat is scarcely released through the substrate 101, when the elements 102a, 102b are fixed on the substrate 101 by conductive pastes, it is unnecessary to pay special attention to the configuration and the quantity of the conductive paste, thereby greatly facilitating the assembly of the elements 102a, 102b and the substrate 101.

The currents output from the elements 102a, 102b are amplified by the operational amplifier 110, and the amplified current signal is immediately taken out. Since it is unnecessary to convert the currents output from the elements first into a voltage signal by the impedance transformation by means of the resistor 5 and further to turn on/off the FET 6 on the basis of the voltage signal unlike in a conventional sensor, there is no influence of the electric time constant which is inevitable in the conventional sensor, thereby enhancing the reliability of the output signals of the elements 102a, 102b.

Figure 4:
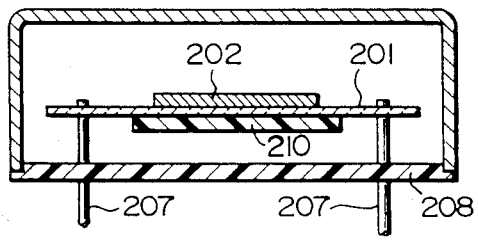
FIG. 4 is a sectional view of the structure of a second embodiment of a pyroelectric infrared sensor according to the present invention, wherein a substrate 201 is composed of a ceramic material $BaO-SiO_2-Al_2O_3-B_2O_3-Cr_2O_3$.

The present invention is not limited to this embodiment and various modifications may be adopted. For example, the hole 109 formed in the substrate 101 in this embodiment may be omitted if the thermal conductivity of a substrate is sufficiently low. FIG. 4 is a sectional view of a second embodiment having such a structure.

In this embodiment, the substrate 201 is a ceramic material which is $BaO-SiO_2-Al_2O_3-B_2O_3-Cr_2O_3$.

This embodiment is also capable of producing a similar effect to that of the first embodiment.

It goes without saying that although the operational amplifier 110 or 210 is adopted in these embodiments, it is possible to use other kinds of amplifiers.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A pyroelectric infrared sensor comprising: a substrate, said substrate comprising a composite material of glass and an epoxy resin; and an element-pair provided on the surface of said substrate so as to output current signals corresponding to the dose of radiation of infrared rays, said substrate having a material having a thermal conductivity of not more than 0.04 (cal/cm sec°C.).

2. A pyroelectric infrared sensor according to claim 1, wherein said substrate comprises $BaO-SiO_2-Al_2O_3-B_2O_3-Cr_2O_3$.

3. A pyroelectric infrared sensor according to claim 1, wherein said substrate is provided with a hole.

4. A pyroelectric infrared sensor according to claim 2, wherein said substrate is provided with a hole.

5. A pyroelectric infrared sensor comprising: a substrate; an element-pair provided on the surface of said substrate so as to output current signals corresponding to the dose of radiation of infrared rays, said substrate comprising a material having a thermal conductivity of not more than 0.04 (cal/cm sec°C.); and an amplification circuit provided on the surface of said substrate so as to amplify current signals output from said element-pair.

6. A pyroelectric sensor according to claim 5, wherein said amplification circuit includes an operational amplifier for executing current amplification.

7. A pyroelectric infrared sensor according to claim 6, wherein said amplification circuit includes a low pass filter for eliminating high-frequency noise from said current signals output from said element-pair.

8. A pyroelectric infrared sensor according to claim 5, wherein said substrate comprises a composite material of glass and an epoxy resin.

9. A pyroelectric infrared sensor according to claim 6, wherein said substrate comprises a composite material of glass and an epoxy resin.

10. A pyroelectric infrared sensor according to claim 7, wherein said substrate comprises a composite material of glass and an epoxy resin.

11. A pyroelectric infrared sensor according to claim 5, wherein said substrate comprises $BaO-SiO_2-Al_2O_3-B_2O_3-Cr_2O_3$.

12. A pyroelectric infrared sensor according to claim 6, wherein said substrate comprises $BaO-SiO_2-Al_2O_3-B_2O_3-Cr_2O_3$.

13. A pyroelectric infrared sensor according to claim 7, wherein said substrate comprises $BaO-SiO_2-Al_2O_3-B_2O_3-Cr_2O_3$.

14. A pyroelectric infrared sensor according to claim 5, wherein said substrate is provided with a hole.

15. A pyroelectric infrared sensor according to claim 6, wherein said substrate is provided with a hole.

16. A pyroelectric infrared sensor according to claim 7, wherein said substrate is provided with a hole.

17. A pyroelectric infrared sensor according to claim 10, wherein said substrate is provided with a hole.

18. A pyroelectric infrared sensor according to claim 13, wherein said substrate is provided with a hole.

* * * * *